(12) United States Patent
Ohkawa

(10) Patent No.: US 8,604,557 B2
(45) Date of Patent: Dec. 10, 2013

(54) SEMICONDUCTOR MEMORY DEVICE AND METHOD FOR MANUFACTURING

(75) Inventor: Narumi Ohkawa, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 257 days.

(21) Appl. No.: 12/331,806

(22) Filed: Dec. 10, 2008

(65) Prior Publication Data

US 2009/0152641 A1   Jun. 18, 2009

(30) Foreign Application Priority Data

Dec. 14, 2007   (JP) .................................. 2007-323921

(51) Int. Cl.
  *H01L 27/088*   (2006.01)
(52) U.S. Cl.
  USPC ........... 257/401; 257/369; 257/774; 257/204; 257/69; 257/288; 257/314; 257/390; 257/E27.098; 257/E21.661; 257/E21.209; 257/E21.645; 257/208; 257/E21.632; 257/E27.108; 257/E27.099; 257/E23.141; 257/E23.011; 257/E23.016; 257/E23.142; 257/E23.143; 257/E23.144; 257/E23.145; 257/E23.152; 257/E23.153; 365/63; 365/72; 365/154; 365/190
(58) Field of Classification Search
  None
  See application file for complete search history.

(56) References Cited

U.S. PATENT DOCUMENTS

| 6,242,297 | B1 | 6/2001 | Ishigaki |
| 7,064,398 | B2 | 6/2006 | Yokohama |
| 2001/0038147 | A1* | 11/2001 | Higashi et al. ................ 257/750 |
| 2002/0063267 | A1* | 5/2002 | Kumagai et al. .............. 257/202 |
| 2005/0141265 | A1 | 6/2005 | Yokoyama |
| 2006/0102957 | A1 | 5/2006 | Liaw |
| 2006/0170023 | A1 | 8/2006 | Nikaido et al. |
| 2006/0192254 | A1 | 8/2006 | Yokoyama |

FOREIGN PATENT DOCUMENTS

| JP | 11-163166 A | 6/1999 |
| JP | 2002-237537 A | 8/2002 |
| JP | 2004-241403 A | 8/2004 |
| JP | 2005-191454 A | 7/2005 |
| JP | 2006-140490 A | 6/2006 |
| JP | 2006-245521 A | 9/2006 |

OTHER PUBLICATIONS

Japanese Office Action dated Dec. 25, 2012, issued in corresponding Japanese Patent Application No. 2007-323921, w/ partial English translation.
Japanese Office Action dated May 7, 2013, issued in corresponding Japanese Patent Application No. 2007-323921, with English translation (6 pages).

* cited by examiner

*Primary Examiner* — Fei Fei Yeung Lopez
(74) *Attorney, Agent, or Firm* — Westerman, Hattori, Daniels & Adrian, LLP

(57) ABSTRACT

A semiconductor memory device includes: a first n-type transistor; a first p-type transistor; a first wiring layer having a first interconnecting portion for connecting a drain of the first n-type transistor and a drain of the first p-type transistor; and a second wiring layer having a first conductive portion electrically connected to the first interconnecting portion.

10 Claims, 10 Drawing Sheets

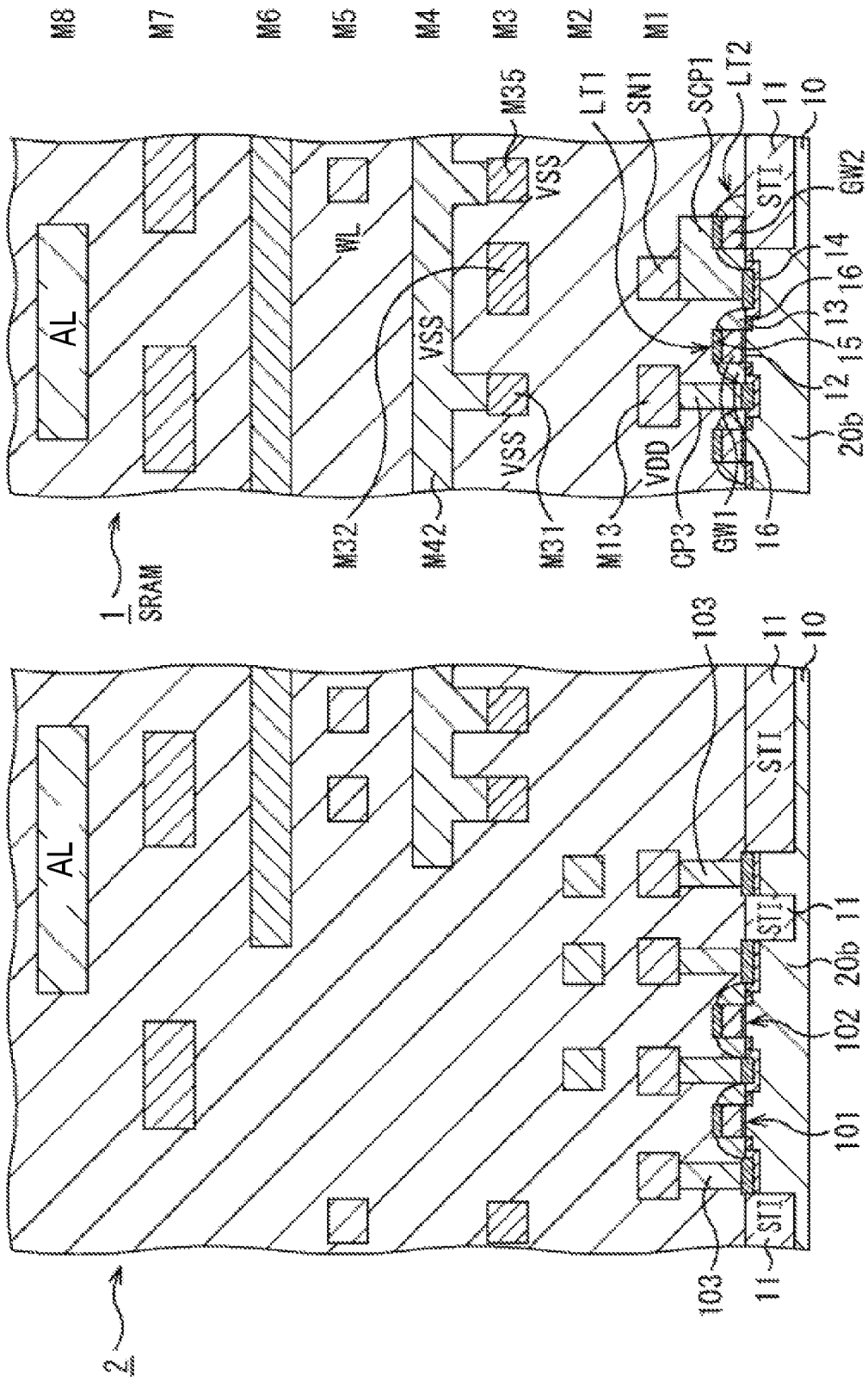

SEMICONDUCTOR MEMORY DEVICE AND METHOD FOR MANUFACTURING

CROSS-REFERENCE TO RELATED APPLICATIONS

This application is based upon and claims the benefit of priority of the prior Japanese Patent Application No. 2007-323921, filed on Dec. 14, 2007, the entire contents of which are incorporated herein by reference.

FIELD

The present invention relates to a semiconductor memory device, a method for manufacturing the semiconductor memory device, and a method for manufacturing an SRAM (Static Random Access Memory).

BACKGROUND

An SRAM has a larger number of elements constituting a memory cell compared, for example, with a DRAM (Dynamic Random Access Memory). Accordingly, the degree of integration of memory cells within a single semiconductor chip is lower compared with that of the DRAM. Since the SRAM is basically composed of so-called flip-flop circuits, however, stored information is continuously maintained as long as a supply voltage is applied, thus requiring no refresh operation. It is therefore possible to simplify system configuration with the SRAM.

In the case of the SRAM, the capacitance of a storage node (accumulation node) has decreased along with the recent miniaturization of memory cells. Because of this decrease in capacitance, a so-called soft error problem has surfaced in which data retained at the storage node is inverted due to electrons generated by alpha rays released from a package, neutron rays flying in from the cosmic space, or the like. Hence, a variety of attempts have been made in order to reduce this soft error.

Japanese Patent Laid-Open Nos. 2004-241403, 2005-191454, 2006-140490 and 2006-245521 disclose configurations in which capacitance is provided between upper and lower electrodes, which are constituent elements of the SRAM, using a capacitance formation step dedicated to storage nodes.

In these configurations, however, a capacitance formation step is required in addition to usual steps of SRAM fabrication, thus incurring an increase in the number of manufacturing steps and in the cost of manufacture. Furthermore, these configurations involve forming a capacitor structure dedicated to a storage node and, therefore, unavoidably complicate device configuration. Consequently, it is difficult for these configurations to meet the recent requirement for further miniaturization with respect to the SRAM.

SUMMARY

According to an aspect of the embodiment, a semiconductor memory device includes: a first n-type transistor; a first p-type transistor; a first wiring layer having a first interconnecting portion for connecting a drain of the first n-type transistor and a drain of the first p-type transistor; and a second wiring layer having a first conductive portion electrically connected to the first interconnecting portion.

According to another aspect of the embodiment, a method for manufacturing a semiconductor memory device includes the steps of: forming a first n-type transistor and a first p-type transistor on a semiconductor substrate; forming an interconnecting portion for connecting a drain of the first n-type transistor and a drain of the first p-type transistor; forming a first insulating film on the interconnecting portion; forming a conductive plug in the first insulating film; and forming a first conductive portion in contact with the conductive plug and a first wiring electrically isolated from the first conductive portion on the first insulating film.

BRIEF DESCRIPTION OF DRAWINGS

FIG. 10 is a cross-sectional view illustrating a schematic configuration of a semiconductor chip equipped with a logic circuit along with an SRAM memory cell according to the embodiment.

DESCRIPTION OF EMBODIMENT

First, an overview of the embodiment will be described.

An SRAM has a configuration in which $V_{DD}$ and $V_{SS}$ layers, which are wiring layers connected to a plurality of inverters and adapted to apply a predetermined voltage, word lines, bit lines and the like are laminated in a multilayered manner.

In the embodiment, conductive layers are disposed in layers above the storage nodes and are electrically connected to at least one storage node. The $V_{DD}$ and $V_{SS}$ layers are disposed in the upper layers and layers adjacent thereto and capacitive couplings are provided between the conductive layers and the $V_{DD}$ and $V_{SS}$ layers and between the conductive layers, thus giving rise to parasitic capacitances. Consequently, the parasitic capacitance of the storage node increases.

It is also possible to form the conductive layers in the same layer as part of the wiring layers of a logic circuit formed along with memory cells, using the same step.

Alternatively, a wiring interconnection layer may be disposed so as to be electrically connected to the wiring layers and to be adjacent to the conductive layers. In this case, the conductive layers also capacitively couple with the wiring interconnection layer as well as with the wiring layers, thereby further increasing the capacitance of the storage node.

As described above, in the embodiment, it is possible to form a conductive layer, which is an isolated pattern electrically connected to a storage node, and a wiring interconnection layer electrically connected to a wiring layer by taking advantage of, for example, a process of forming part of the wiring layers of a logic circuit. Consequently, it is possible to dramatically increase the capacitance of a storage node and realize a sufficient reduction in soft errors by means of extremely simple configuration, without incurring an increase in the number of manufacturing steps and in the cost of manufacture. As a result, it is possible to fully meet a requirement for the further miniaturization of an SRAM.

Next, specific examples of the embodiment will be described.

Hereinafter, a description will be made in detail of the specific examples in light of the above overview of the embodiment, while referring to the accompanying drawings.

Figure 1:
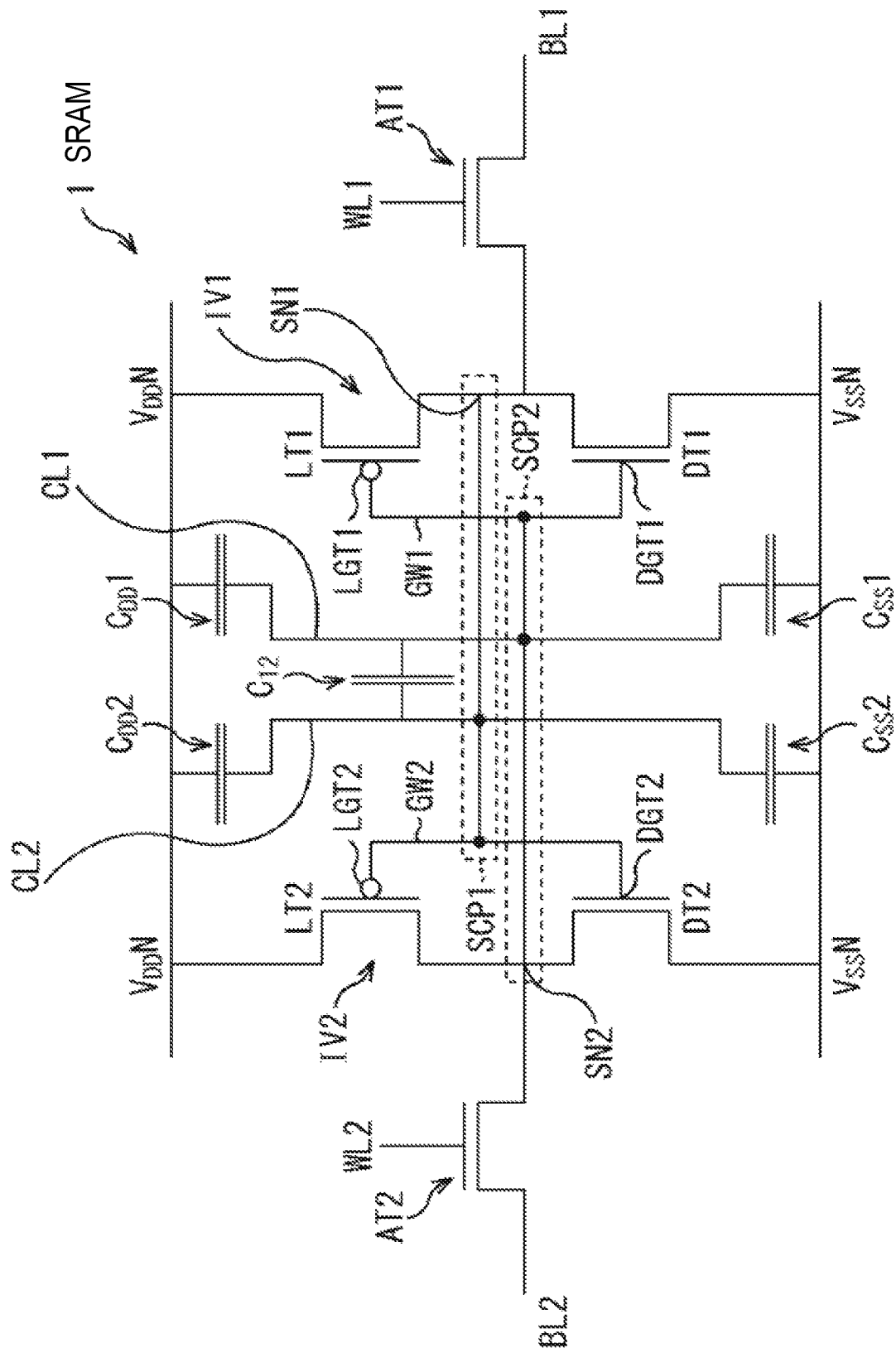
FIG. 1 is a circuit diagram illustrating a wiring configuration of an SRAM memory cell according to the described embodiment.

FIG. 1 is a circuit diagram illustrating a wiring configuration of an SRAM memory cell according to the embodiment.

As shown in FIG. 1, an SRAM memory cell 1 of the embodiment is provided with a pair of CMOS inverters IV1 and IV2 and first and second access transistors (transfer transistors) AT1 and AT2. In addition, there are provided a $V_{DD}$ node $V_{DD}N$ for supplying a high potential $V_{DD}$ and a $V_{SS}$ node $V_{SS}N$ for supplying a low potential $V_{SS}$ (ground potential) to the respective terminals of the CMOS inverters IV1 and IV2.

In the CMOS inverter IV1, a first load transistor LT1 which is a P-type MOS transistor and a first driving transistor DT1 which is an N-type MOS transistor share a first gate wiring GW1 as a common gate, and are provided with a first storage node SN1. That is, the first gate wiring GW1 connects the gate terminal LGT1 of the first load transistor LT1 and the gate terminal DGT1 of the first driving transistor DT1.

Likewise in the CMOS inverter IV2, a second load transistor LT2 which is a P-type MOS transistor and a second driving transistor DT2 which is an N-type MOS transistor share a second gate wiring GW2 as a common gate, and are provided with a second storage node SN2. That is, the second gate wiring GW2 connects the gate terminal LGT2 of the second load transistor LT2 and the gate terminal DGT2 of the second driving transistor DT2.

The first storage node SN1 and the second gate wiring GW2 are connected to each other by a first shared contact plug SCP1. Likewise, the second storage node SN2 and the first gate wiring GW1 are connected to each other by a second shared contact plug SCP2. Consequently, the CMOS inverters IV1 and IV2 are interconnected. The CMOS inverters IV1 and IV2 thus cross-linked cause the potentials of the first and second storage nodes SN1 and SN2 to be respectively set one and the other mutually complementary levels, i.e., a $V_{DD}$ level (hereinafter also referred to as an "H level") and a $V_{SS}$ level (hereinafter also referred to as an "L level").

In the embodiment, there are formed a first conductive layer CL1 which is an isolated pattern connected only to the first storage node SN1 and a second conductive layer CL2 which is an isolated pattern connected only to the second storage node SN2, as will be described later using FIGS. 2 to 9. As a result of adding the first conductive layer CL1, capacitive couplings are provided between the first conductive layer CL1 and the $V_{DD}$ node $V_{DD}N$ and between the first conductive layer CL1 and the $V_{SS}$ node $V_{SS}N$, thus giving rise to parasitic capacitances $C_{DD}1$ and $C_{SS}1$, respectively. Likewise, as a result of adding the second conductive layer CL2, capacitive couplings are provided between the second conductive layer CL2 and the $V_{DD}$ node $V_{DD}N$ and between the second conductive layer CL2 and the $V_{SS}$ node $V_{SS}N$, thus giving rise to parasitic capacitances $C_{DD}2$ and $C_{SS}2$ respectively. Furthermore, a capacitive coupling is also provided between the first conductive layer CL1 and the second conductive layer CL2, thus giving rise to a parasitic capacitance $C_{12}$. Although two isolated patterns are shown in the embodiment, there is no need to always form two isolated patterns. Alternatively, an isolated pattern may be formed only in one of the storage nodes.

A first access transistor AT1 which is an NMOS transistor is connected to the first storage node SN1. A second access transistor AT2 which is also an NMOS transistor is connected to the second storage node SN2. The first gate wiring AG1 of the first access transistor AT1 is connected to a first word line WL1. The second gate wiring AG2 of the second access transistor AT2 is connected to a second word line WL2. The first and second word lines WL1 and WL2 may be connected to each other to use the word lines as a common word line. A first bit line BL1 is connected to one end of the first access transistor AT1. Likewise, a second bit line BL2 is connected to one end of the second access transistor AT2.

In the above-described SRAM memory cell, data writing to or data reading from the first and second storage nodes SN1 and SN2 is carried out through the complementary first and second bit lines BL1 and BL2, respectively, in an activated (H level) period of the first and second word lines WL1 and WL2. The data once written to the first and second storage nodes SN1 and SN2 is retained stably by the cross-linked two inverters IV1 and IV2 in a deactivated (L level) period of the first and second word lines WL1 and WL2.

Figure 2:
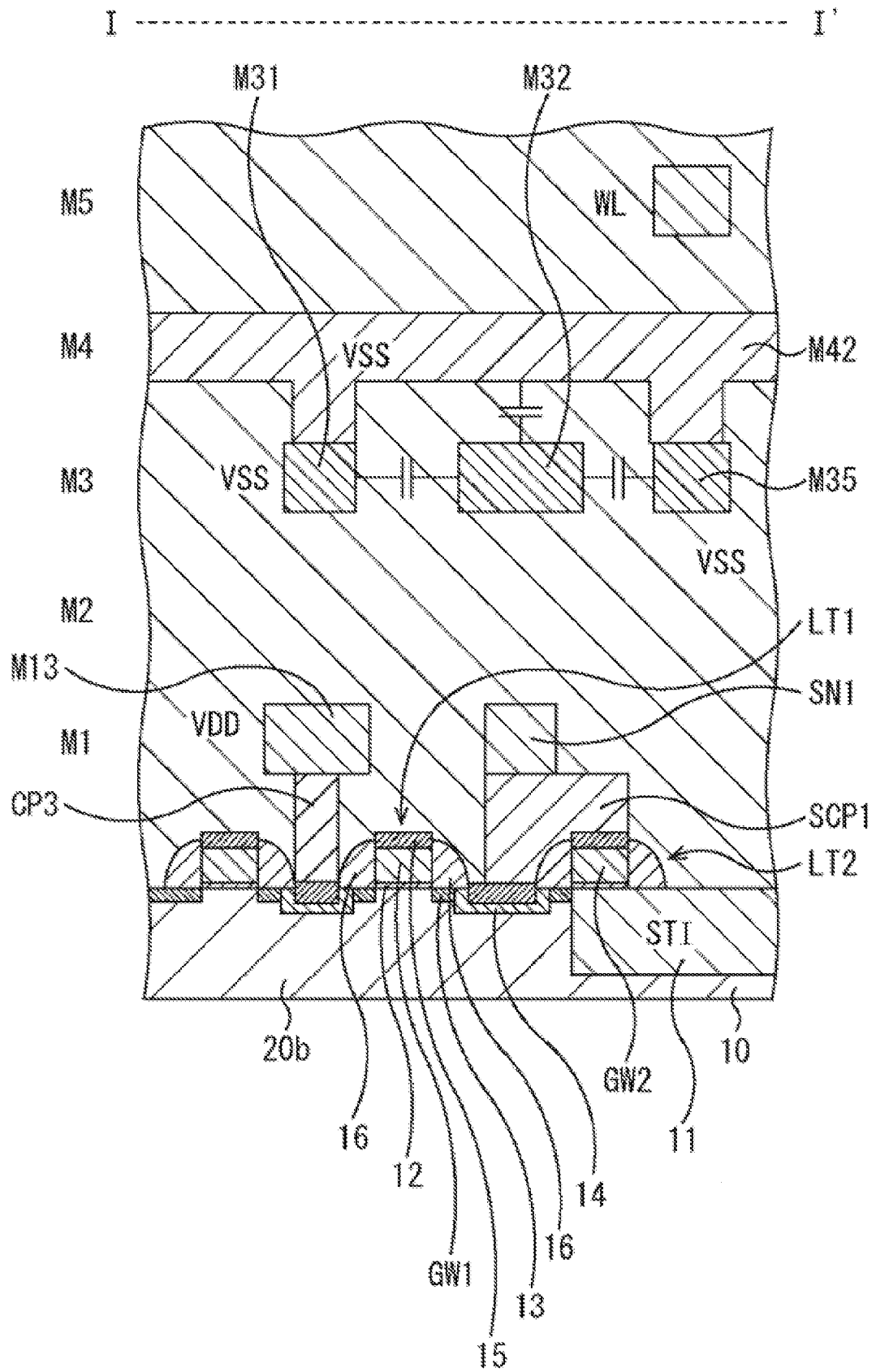
FIG. 2 is a cross-sectional view illustrating a schematic configuration of an SRAM memory cell according to the embodiment.
Figure 3:
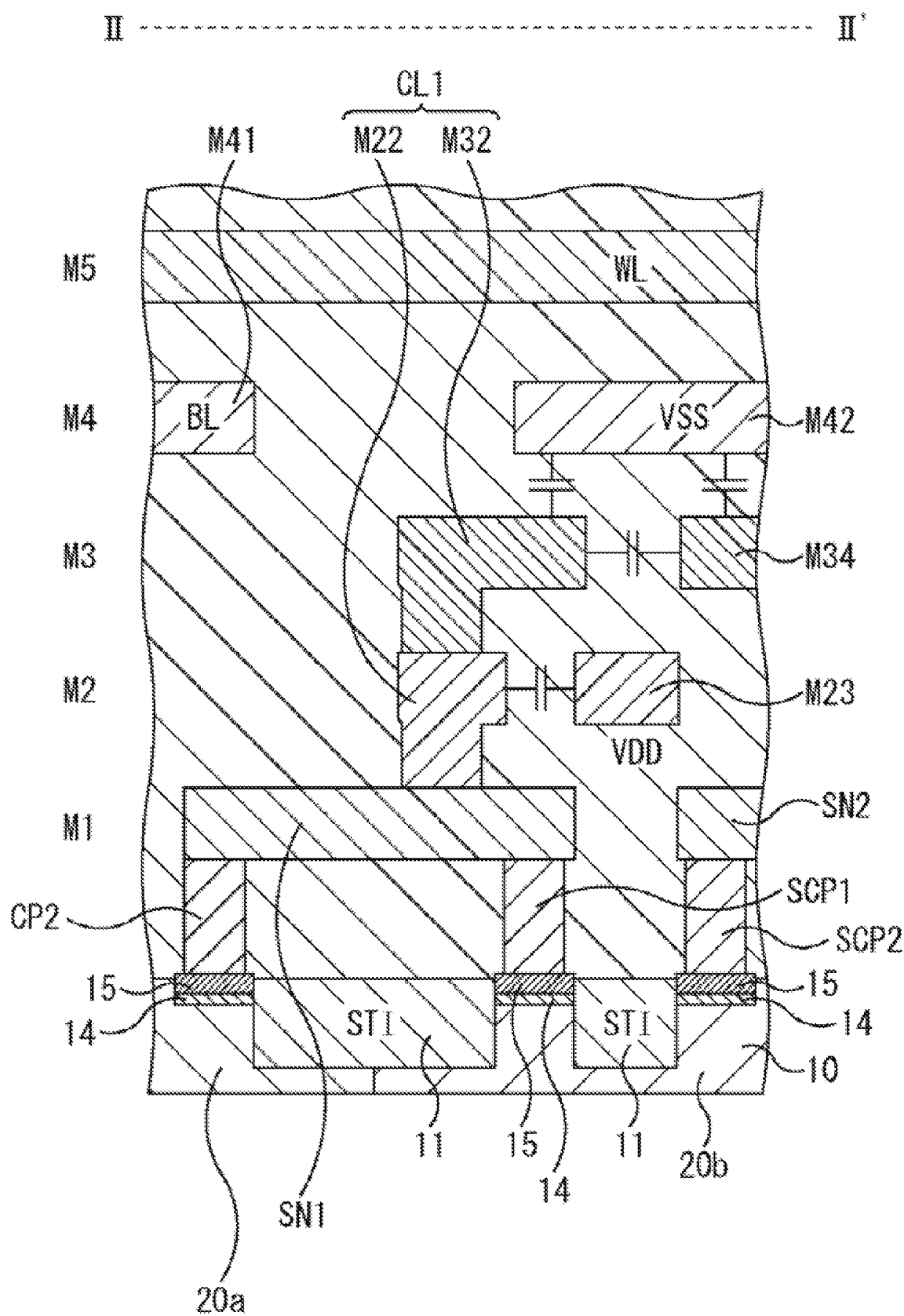
FIG. 3 is a cross-sectional view illustrating a schematic configuration of an SRAM memory cell according to the embodiment.

The SRAM memory cell 1 of FIG. 1 has such a laminated configuration as shown in, for example, FIGS. 2 and 3. Hereinafter, a description will be made of the configuration of the SRAM memory cell 1 according to a manufacturing process, using the respective plan views of FIGS. 4 to 9 along with FIGS. 2 and 3. In the following description, attention will be focused on one particular SRAM memory cell 1 to discuss the constituent elements thereof. Accordingly, no reference symbols and the like will be assigned to drawings with regard to the constituent elements of SRAM memory cells other than the SRAM memory cell 1 on which attention is focused, though the constituent elements will also be illustrated.

Figure 5:
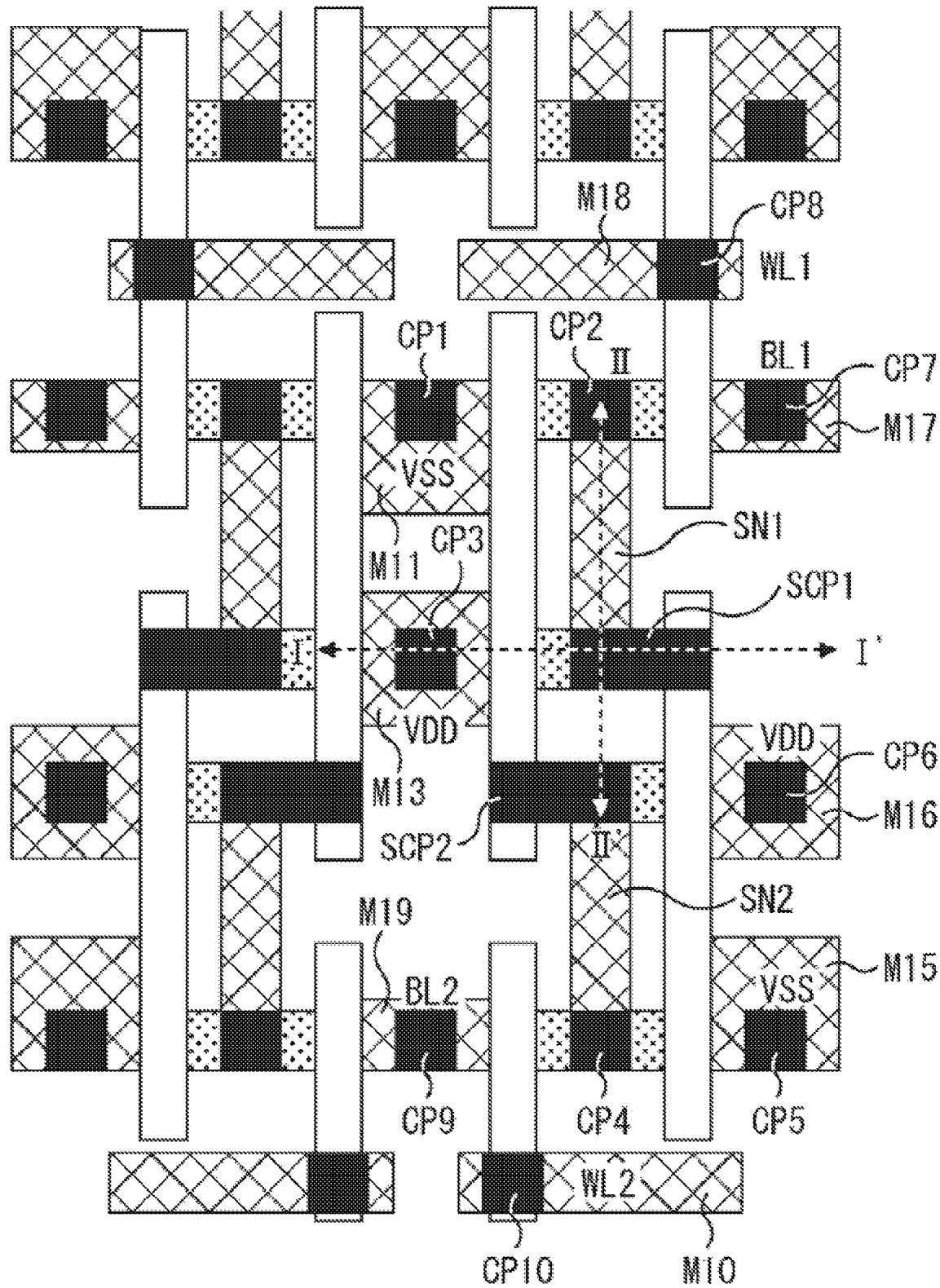
FIG. 5 is a plan view illustrating a step of manufacturing an SRAM memory cell according to the embodiment.
Figure 6:
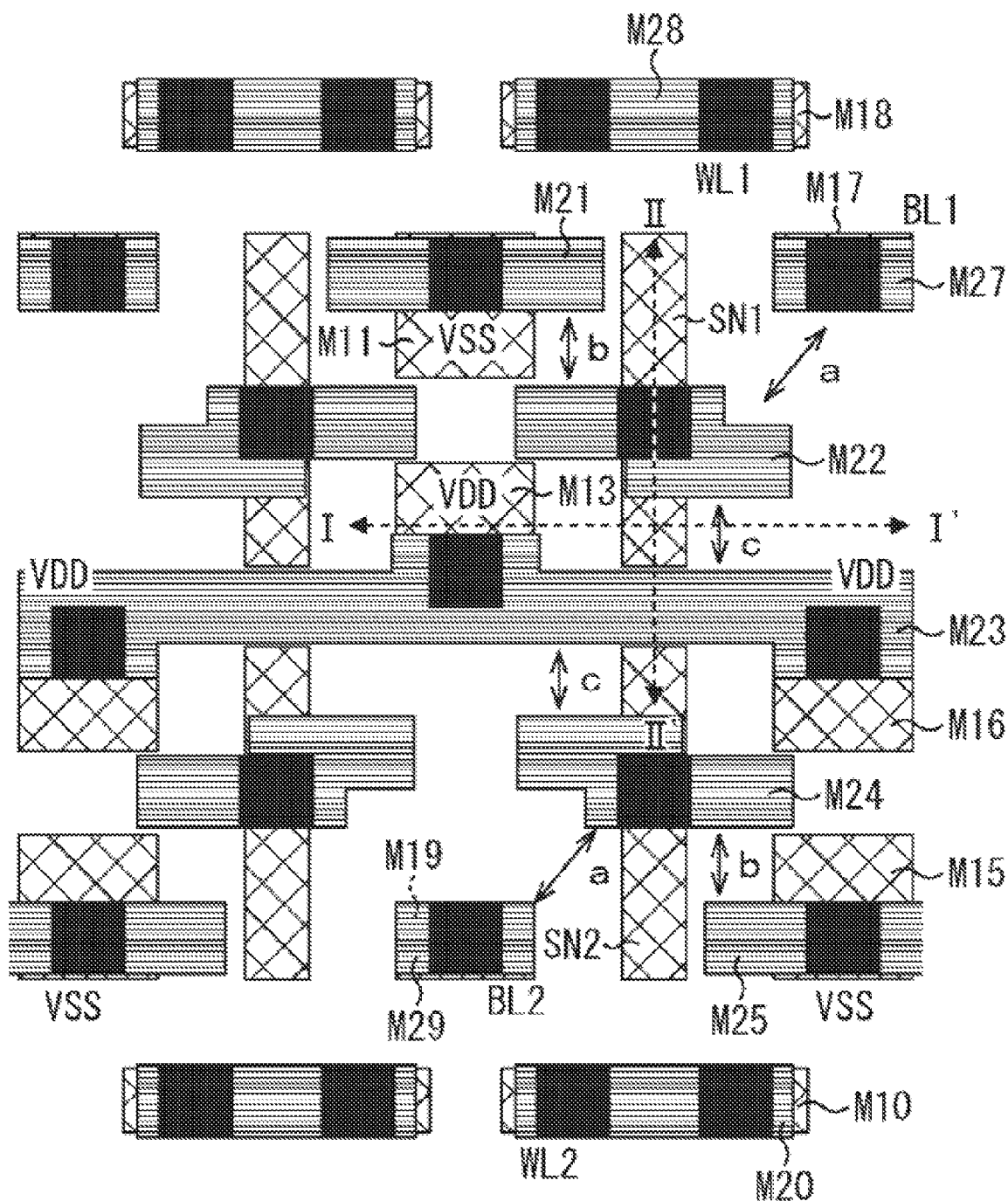
FIG. 6 is a plan view illustrating a step of manufacturing an SRAM memory cell according to the embodiment.
Figure 7:
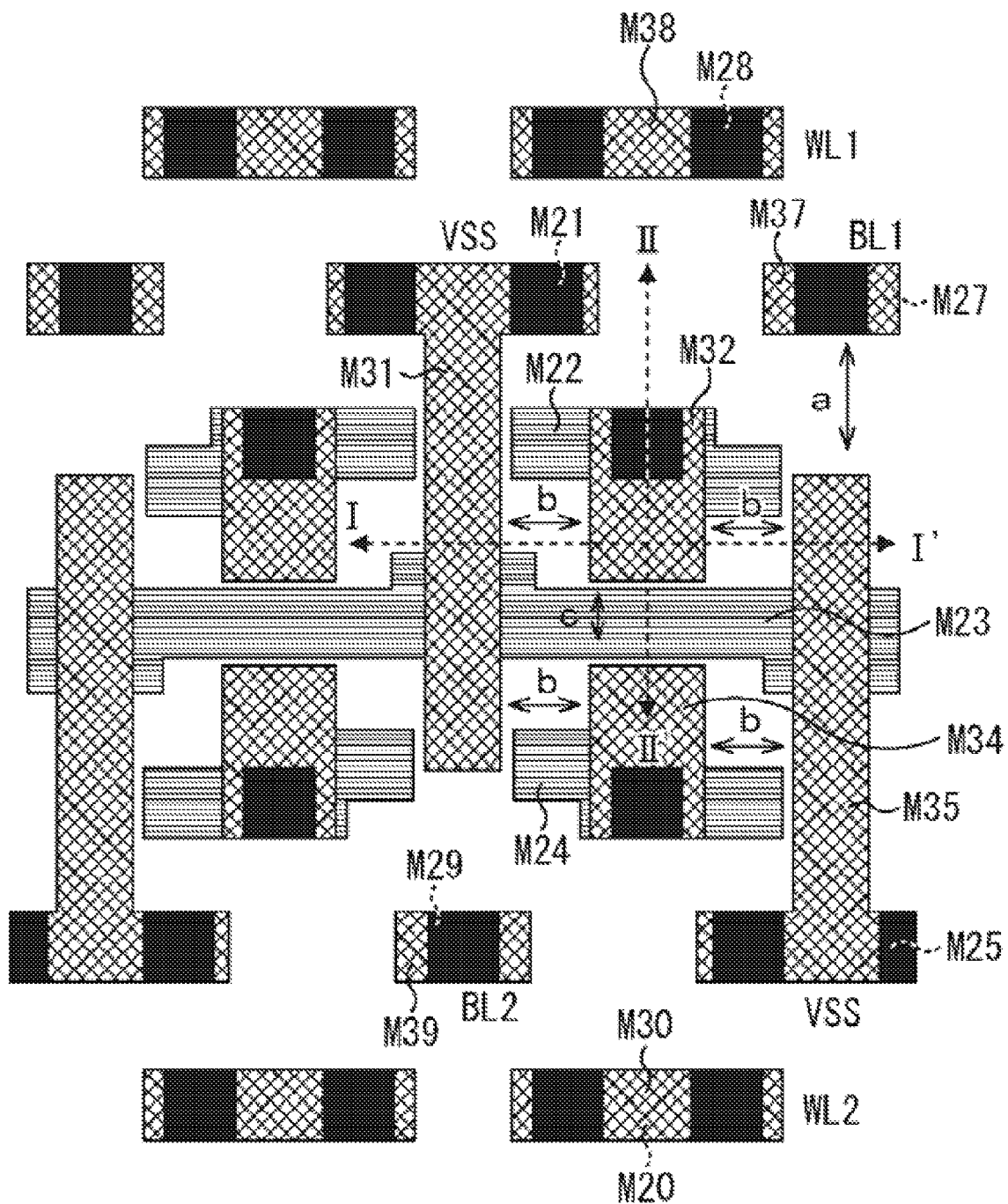
FIG. 7 is a plan view illustrating a step of manufacturing an SRAM memory cell according to the embodiment.
Figure 8:
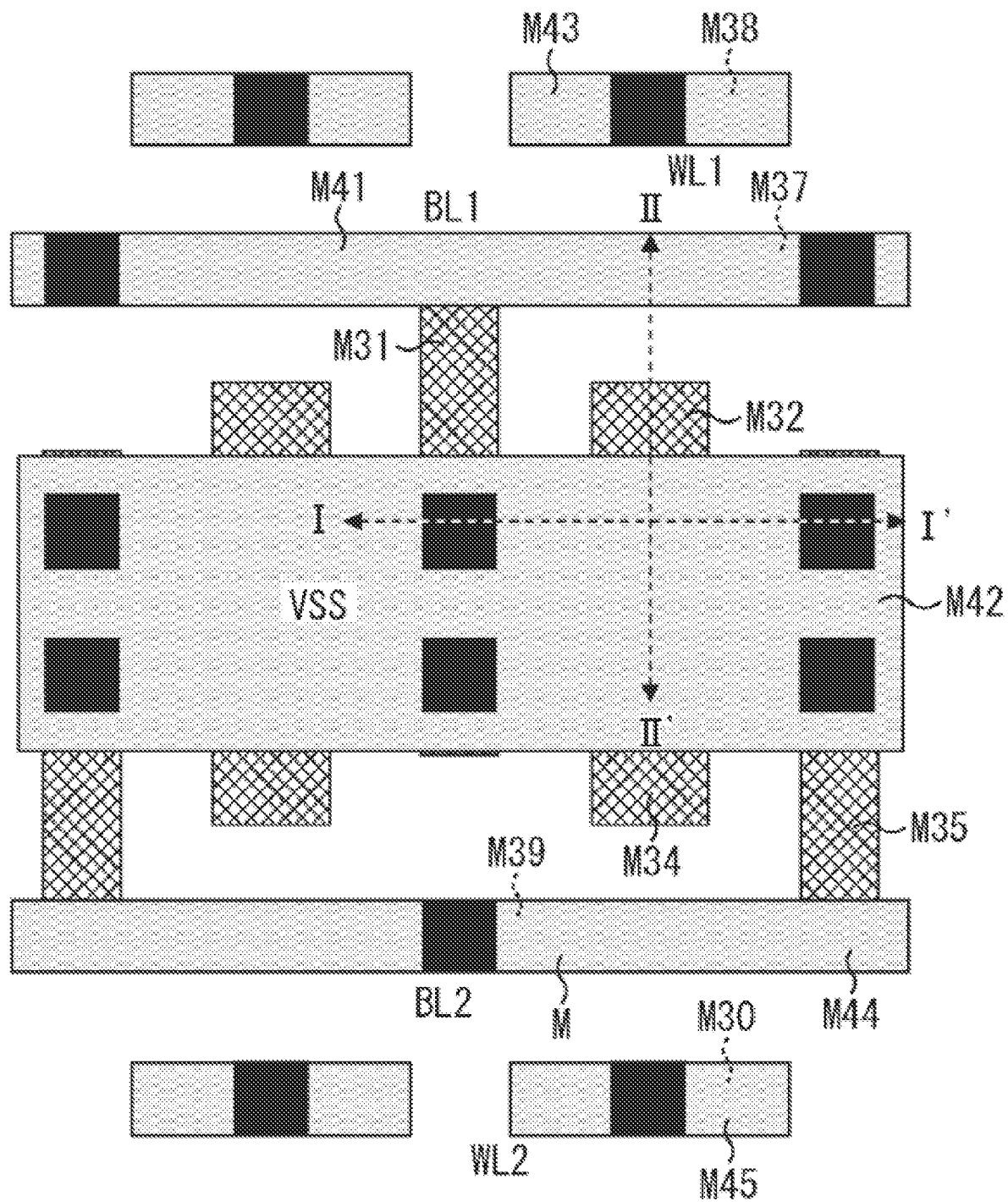
FIG. 8 is a plan view illustrating a step of manufacturing an SRAM memory cell according to the embodiment.
Figure 9:
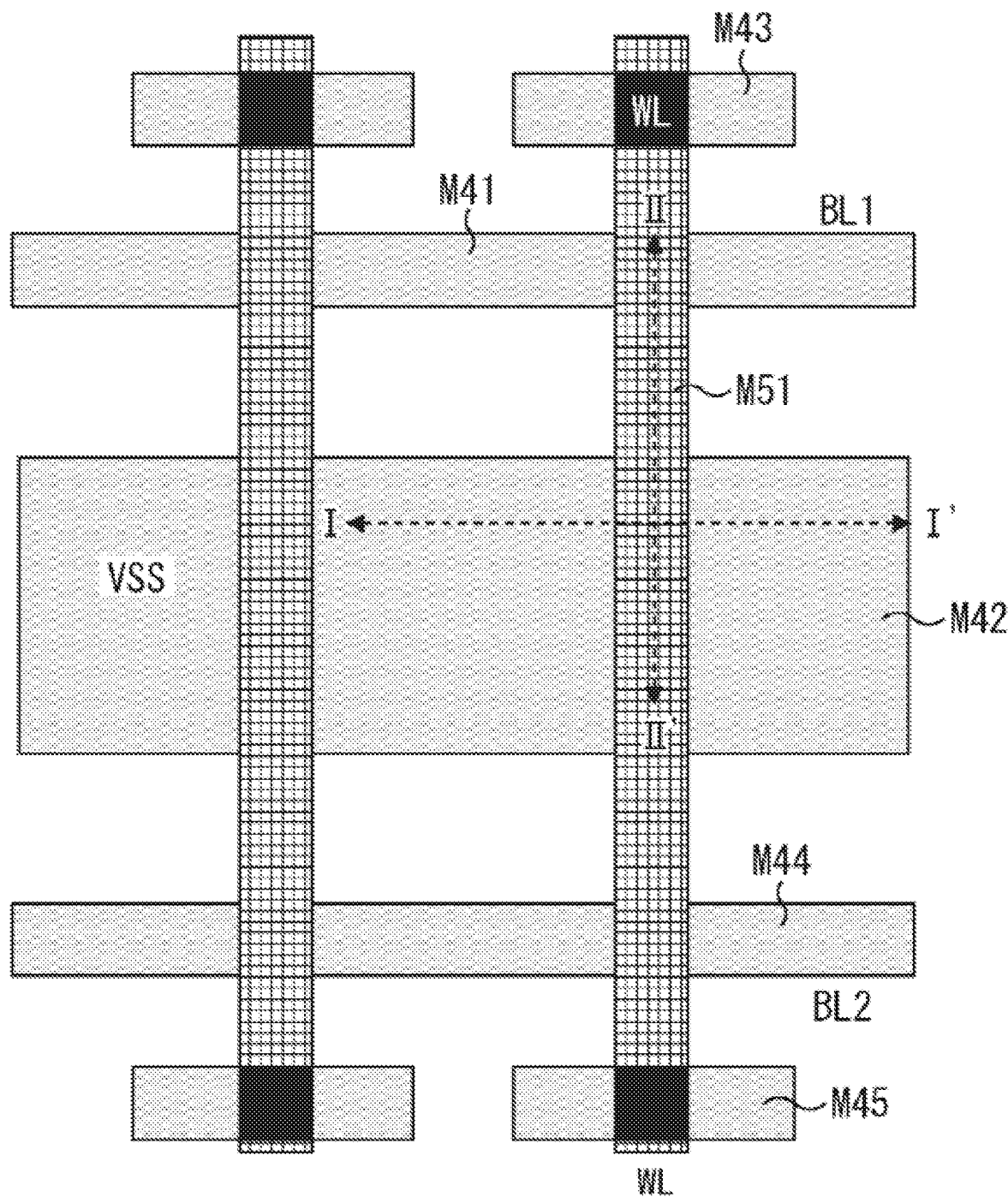
FIG. 9 is a plan view illustrating a step of manufacturing an SRAM memory cell according to the embodiment.

In addition, FIG. 2 illustrates a cross section as viewed along the broken line I-I' in FIGS. 4 to 9. FIG. 3 illustrates a cross section as viewed along the broken line II-II' in FIGS. 4 to 9. Note that interlayer insulating films exist between a silicon substrate and a first wiring layer and between respective laminated wiring layers. For convenience of illustration, however, these interlayer insulating films will not be depicted distinctly. That is, these interlayer insulating films are simply referred to herein as "interlayer insulating films" for standardized notation. In addition, FIG. 7 shows only the second wiring layer and layers above the second wiring layer. FIG. 8 shows only the third wiring layer and layers above the third wiring layer. FIG. 9 shows only the fourth wiring layer and layers above the fourth wiring layer.

Figure 4:
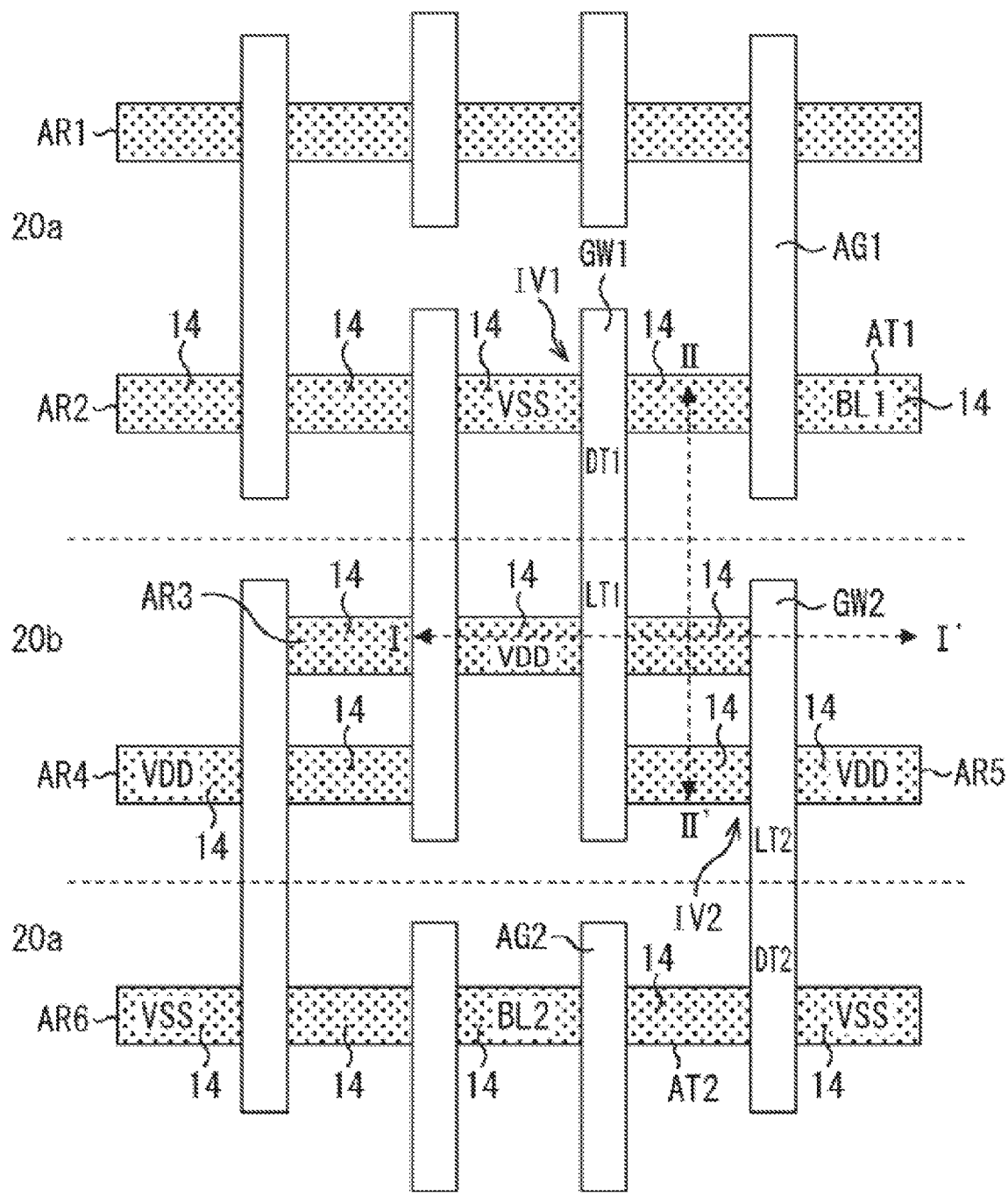
FIG. 4 is a plan view illustrating a step of manufacturing an SRAM memory cell according to the embodiment.

First, as shown in FIGS. 2, 3 and 4, various types of transistors and the like are formed.

More specifically, an element isolation structure 11 is first formed on, for example, a silicon substrate 10 using a predetermined element-isolating method, for example, an STI (Shallow Trench Isolation) method, to define active regions which are active regions AR1 to AR6 here.

Next, a p-type impurity or an N-type impurity is ion-implanted to the surface layers of the active regions AR1 to AR6, respectively, using a lithography process. When ion-implanting the P-type (N-type) impurity, a resist mask for covering a portion into which the N-type (P-type) impurity is introduced is used. As a result of ion-implanting these impurities, a P-type well region 20a and an N-type well region 20b are formed in the silicon substrate 10.

Next, various gate wirings, which are the first gate wiring GW1 of the CMOS inverter IV1, the second gate wiring GW2 of the CMOS inverter IV2, the first gate wiring AG1 of the first access transistor AT1, and the second gate wiring AG2 of the second access transistor AT2 here, are formed on the silicon substrate 10 through the gate insulating film 12.

Next, a P-type impurity or an N-type impurity is ion-implanted, as appropriate, to both sides of each gate wiring in the active regions AR1 to AR6. Consequently, extension regions 13 (for convenience sake, the same reference number is assigned to all transistors) are formed in the active regions AR1 to AR6, respectively.

Next, a sidewall insulating film 16 is formed on both side surfaces of each gate wiring. After that, the P-type impurity or the N-type impurity is ion-implanted once again, as appropriate. Consequently, source/drain regions 14 (for convenience sake, the same reference number is assigned to all transistors) joined to the extension regions 13 are formed in the active regions AR1 to AR6.

After that, a silicide process is performed as appropriate to form a silicide layer 15 on the gate wirings and on the source/drain regions.

As a result, there are formed various types of transistors, which are the CMOS inverter IV1 including the first load transistor LT1 and first driving transistor DT1, the CMOS inverter IV2 including the second load transistor LT2 and second driving transistor DT2, the first access transistor AT1, and the second access transistor AT2 in this embodiment.

Then, as shown in FIGS. 2, 3 and 5, various types of contact plugs and a first wiring layer M1 are formed. Specifically, an interlayer insulating film is formed first, and then W plugs are formed as the conductive plugs, for example.

As for the CMOS inverter IV1, contact plugs CP1 and CP2 are formed in the source/drain regions 14 of the first driving transistor DT1. A contact plug CP3 is formed in one source/drain region 14 of the first load transistor LT1. A first shared contact plug SCP1 is formed in the other source/drain region 14 of the first load transistor LT1. A second shared contact plug SCP2 is formed in the first gate wiring GW1.

As for the CMOS inverter IV2, contact plugs CP4 and CP5 are formed in the source/drain regions 14 of the second driving transistor DT2. A contact plug CP6 is formed in one source/drain region 14 of the second load transistor LT2. A second shared contact plug SCP2 is formed in the other source/drain region 14 of the second load transistor LT2. A first shared contact plug SCP1 is formed in the second gate wiring GW2.

Note here that the first shared contact plug SCP1 connects the source/drain region 14 and the second gate wiring GW2 of the first load transistor LT1. In addition, the second shared contact plug SCP2 connects the source/drain region 14 of the second load transistor LT2 and the first gate wiring GW1.

As for the first access transistor AT1, a contact plug CP2 is formed in one source/drain region 14 thereof. A contact plug CP7 is formed in the other source/drain region 14. A contact plug CP8 is formed in the first gate wiring AG1.

As for the second access transistor AT2, a contact plug CP4 is formed in one source/drain region 14 thereof. A contact plug CP9 is formed in the other source/drain region 14. A contact plug CP10 is formed in the second gate wiring AG2. These contact plugs are formed using the same process including lithography and dry etching.

Next, a first wiring layer M1 is formed. The respective wiring layers included in the first wiring layer M1 are formed by means of a so-called damascene method using a conductive material containing copper or copper alloy, which is a single damascene method here. The single damascene method is a method for forming wirings only. Although an embodiment is shown here in which wiring layers are formed by means of a damascene method using a conductive material containing copper or copper alloy, the wirings may be formed by means of etching after depositing an Al layer.

More specifically, as illustrated in FIGS. 2, 3 and 5, a wiring layer M11 to be connected to the contact plug CP1, a first storage node SN1 which is a wiring layer to be connected to the contact plug CP2 and the first shared contact plug SCP1, a wiring layer M13 to be connected to the contact plug CP3, a second storage node SN2 which is a wiring layer to be connected to the contact plug CP4 and the second shared contact plug SCP2, a wiring layer M15 to be connected to the contact plug CP5, a wiring layer M16 to be connected to the contact plug CP6, a wiring layer M17 to be connected, to the contact plug CP7, a wiring layer M18 to be connected to the contact plug. CP8, a wiring layer M19 to be connected to the contact plug CP9, and a wiring layer M10 to be connected to the contact plug CP10 are respectively formed in the same process based on a single damascene method.

Then, as shown in FIGS. 2, 3 and 6, a second wiring layer M2 is formed.

The respective wiring layers included in the second wiring layer M2 are formed by means of a damascene method, which is a dual damascene method here, using a conductive material containing copper or copper alloy. The dual damascene method is a method for forming wiring portions and via holes to be connected thereto in the same process. The embodiment is not limited to the damascene method. Alternatively, wirings may be formed by means of etching.

More specifically, a wiring layer M21 to be connected to the wiring layer M11, an isolated pattern M22 to be connected only to the first storage node SN1 by a via portion, a belt-like wiring layer M23 to be connected to the wiring layer M13 and the wiring layer M16 by via portions and serving as a $V_{DD}$ node $V_{DD}N$, an isolated pattern M24 to be connected only to the second storage node SN2 by a via portion, a wiring layer M25 to be connected to the wiring layer M15 by a via portion, a wiring layer M27 to be connected to the wiring layer M17 by a via portion, a wiring layer M28 to be connected to the wiring layer M18 by a via portion, a wiring layer M29 to be connected to the wiring layer M19 by a via portion, and a wiring layer M20 to be connected to the wiring layer M10 by a via portion are respectively formed in the same layer.

In the second wiring layer M2, capacitive couplings are provided between the isolated pattern M22 and the wiring layer M21 serving as part of the $V_{SS}$ node and between the isolated pattern M22 and the wiring layer M23 serving as the $V_{DD}$ node, through interlayer insulating films, thus giving rise to parasitic capacitances.

Likewise, capacitive couplings are provided between the isolated pattern M24 and the wiring layer M25 serving as part of the $V_{SS}$ node and between the isolated pattern M24 and the wiring layer M23 constituting the $V_{DD}$ node, through interlayer insulating films, thus increasing the parasitic capacitances.

Note here that in the second wiring layer M2, a distance "a" between the isolated pattern M22 and the wiring layer M27 serving as part of the bit lines is larger than a distance "b" between the isolated pattern M22 and the wiring layer M21 serving as part of the $V_{SS}$ node and than a distance "c" between the isolated pattern M22 and the wiring layer M23 serving as the $V_{DD}$ node.

Likewise, a distance "a" between the isolated pattern M24 and the wiring layer M29 serving as part of the bit lines is larger than a distance "b" between the isolated pattern M24 and the wiring layer M25 serving as part of the $V_{SS}$ node and than a distance "c" between the isolated pattern M22 and the wiring layer M23 constituting the $V_{DD}$ node.

By locating the isolated patterns M22 and M24 as distant as possible from the wiring layers M27 and M29 to serve as part of the bit lines, as described above, it is possible to reduce the parasitic capacitance of the bit lines.

Then, as shown in FIGS. 2, 3 and 7, a third wiring layer M3 is formed.

The respective wiring layers included in the third wiring layer M3 are formed by means of a damascene method or the like using a conductive material containing copper, copper alloy or aluminum.

More specifically, a wiring layer M31 to be connected to the wiring layer M21 by a via portion, an isolated pattern M32 to be connected only to the isolated pattern M22 by a via portion, an isolated pattern M34 to be connected only to the isolated pattern M24 by a via portion, a wiring layer M35 to be connected to the wiring layer M25 by a via portion, a wiring layer M37 to be connected to the wiring layer M27 by a via portion, a wiring layer M38 to be connected to the wiring layer M28 by a via portion, a wiring layer M39 to be connected to the wiring layer M29 by a via portion, and a wiring layer M30 to be connected to the wiring layer M20 by a via portion are respectively formed in the same layer. These wiring layers can be formed using, for example, the same damascene process.

In the embodiment, a first conductive layer CL1 in an isolated form connected only to the first storage node SN1 is composed of the isolated patterns M22 and M32. In addition, a second conductive layer CL2 in an isolated form connected only to the second storage node SN2 is composed of the isolated patterns M24 and M34.

Note here that the wiring layers M31 and M35 are wiring interconnection layers formed into a shape having an extension portion, so as to be as close as possible to the isolated patterns M22 and M24.

In the third wiring layer M3, capacitive couplings are provided between the isolated pattern M32 and the wiring layer M31 to serve as part of the $V_{SS}$ node and between the isolated pattern M32 and the wiring layer M35 to serve as part of the $V_{SS}$ node, through interlayer insulating films, thus giving rise to parasitic capacitances.

Likewise, capacitive couplings are provided between the isolated pattern M34 and the wiring layer M31 to serve as part of the $V_{SS}$ node and between the isolated pattern M34 and the wiring layer M35 to serve as part of the $V_{SS}$ node, through interlayer insulating films, thus giving rise to parasitic capacitances.

Furthermore, a capacitive coupling is also provided between the isolated pattern M32 and the isolated pattern M34, through an interlayer insulating film, thus increasing the parasitic capacitances.

Note here that in the third wiring layer M3, a distance "a" between the wiring layer M37 to serve as part of the bit lines and the wiring layer M35 to serve as part of the $V_{SS}$ node is larger than a distance "b" between the isolated pattern M32 and the wiring layers M31 and M35 to serve as part of the $V_{SS}$ node and than a distance "c" between the isolated pattern M32 and the isolated pattern M34.

Likewise, a distance "a" between the wiring layer M39 to serve as part of the bit lines and the wiring layer M31 to serve as part of the $V_{SS}$ node is larger than a distance "b" between the isolated pattern M34 and the wiring layers M31 and M35 to serve as part of the $V_{SS}$ node and than a distance "c" between the isolated pattern M34 and the isolated pattern M32.

By locating the isolated patterns M32 and M34 as distant as possible from the wiring layers M37 and M39 to serve as part of the bit lines, as described above, it is possible to reduce the parasitic capacitance of the bit lines.

Then, as shown in FIGS. 2, 3 and 8, a fourth wiring layer M4 is formed.

The respective wiring layers constituting the fourth wiring layer M4 are formed using a conductive material containing copper, copper alloy or aluminum.

More specifically, a belt-like wiring layer M41 extending over the wiring layers M31 and M37 through an interlayer insulating film and serving as a first bit line BL1 connected to the wiring layer M37 by a via portion, a belt-like wiring layer M42 covering part of the wiring layers M31 and M35 and part of the isolated patterns M32 and M34 and to be connected to the wiring layers M31 and M35 respectively by via portions to constitute the $V_{SS}$ node $V_{SS}N$, a wiring layer M43 to be connected to the wiring layer M38 by a via portion, a belt-like wiring layer M44 extending over the wiring layer M39 through an interlayer insulating film and serving as a second bit line BL2 connected to the wiring layer M39 by a via portion, and a wiring layer M45 including the wiring layer M30 and a via portion are respectively formed in the same layer.

In the fourth wiring layer M4, a capacitive coupling is provided, through an interlayer insulating film, between the isolated pattern M32 of the third wiring layer M3 and the wiring layer M42 in a portion where the isolated pattern M32 and the wiring layer M42 overlap with each other in plan view, thus giving rise to a parasitic capacitance.

Likewise, a capacitive coupling is provided, through an interlayer insulating film, between the isolated pattern M34 of the third wiring layer M3 and the wiring layer M42 in a portion where the isolated pattern M34 and the wiring layer M42 overlap with each other in plan view, thus giving rise to a parasitic capacitance.

As described above, in the embodiment, the first storage node SN1 is made to capacitively couple with the $V_{DD}$ node $V_{DD}N$ and the $V_{SS}$ node $V_{SS}N$, through interlayer insulating films, by the first conductive layer CL1 including the isolated patterns M22 and M32 connected to the first storage node SN1, thus giving rise to parasitic capacitances $C_{DD}1$ and $C_{SS}1$, respectively.

Likewise, the second storage node SN2 is made to capacitively couple with the $V_{DD}$ node $V_{DD}N$ and the $V_{SS}$ node $V_{SS}N$, through interlayer insulating films, by the second conductive layer CL2 including the isolated patterns M24 and M34, thus giving rise to parasitic capacitances $C_{DD}2$ and $C_{SS}2$, respectively.

Then, as shown in FIGS. 2, 3 and 9, a fifth wiring layer M5 is formed.

The respective wiring layers constituting the fifth wiring layer M5 are formed using a conductive material containing copper, copper alloy or aluminum.

More specifically, there is formed a belt-like wiring layer M51 extending through the fourth wiring layer M4 and an interlayer insulating film and connected to, for example, the wiring layers M43 and M45 by via portions to serve as a word line WL (shared by WL1 and WL2), so as to be orthogonal to the wiring layers M41 and M44 serving as the first and second bit lines.

Note here that effects by a potential change in the word line upon the first and second storage nodes SN1 and SN2 are cut off by interposing the wiring layer M42 between the first and second conductive layers CL1 and CL2 and the wiring layer M51. Consequently, stable capacitive couplings can be obtained for the first and second storage nodes SN1 and SN2.

Subsequently, an SRAM memory cell according to the embodiment is completed by going through various steps, including forming a sixth wiring layer M6 and a seventh wiring layer M7 by means of a damascene method, forming the Al wiring of an eighth wiring layer M8 using an aluminum-containing conductive material, and forming a protective film. Note here that the seventh wiring layer M7 and the eighth wiring layer M8 are used as capacitors making use of capacitance between power lines or capacitance between wirings.

Additionally, a logic circuit provided with MOS transistors, CMOS inverters and the like can be equipped on the silicon substrate along with the SRAM memory cell.

In this case, it is possible to form the SRAM memory cell containing the first and second conductive layers CL1 and CL2 and the like along with the logic circuit in the same step, by taking advantage of a process of forming the logic circuit.

FIG. 10 is a cross-sectional view illustrating a schematic configuration of a semiconductor chip equipped with a logic circuit along with an SRAM memory cell. In FIG. 10, the left-side drawing shows a schematic cross section of a logic circuit portion 2 and the right-side drawing shows a schematic cross section of an SRAM memory cell 1 (the same figure as FIG. 2).

The logic circuit portion 2 is provided with MOS transistors 101 and 102 and the like identical to various types of transistors the SRAM memory cell includes. A contact plug 103 is formed in the same step as used for the contact plugs CP1 to CP10 and the shared contact plugs SCP1 and SCP2 of the SRAM memory cell.

Then, the first wiring layer M1 to the eighth wiring layer M8 of the logic circuit portion 2 are formed in the same step as used for the respective wiring layers of the first wiring layer M1 to the eighth wiring layer M8 and the like of the SRAM memory cell 1.

As described heretofore, the first and second conductive layers CL1 and CL2 are disposed in a layer above each storage node, so as to be electrically connected to the first and second storage nodes SN1 and SN2 of the respective CMOS inverters IV1 and IV2. The $V_{DD}$ node $V_{DD}N$ and the $V_{SS}$ node $V_{SS}N$ are disposed in the upper layer and a layer adjacent thereto. Accordingly, capacitive couplings are provided between the first and second conductive layers CL1 and CL2 and the $V_{DD}$ node $V_{DD}N$ and the $V_{SS}$ node $V_{SS}N$, and between the first and second conductive layers CL1 and CL2, thus giving rise to parasitic capacitances. This configuration increases the capacitances of the first and second storage nodes SN1 and SN2.

On the same silicon substrate 10, the first and second conductive layers CL1 and CL2 can be formed in the same layer as part of the wiring layers of the logic circuit portion 2 formed along with the SRAM memory cell and in the same step.

In addition, parts of each of the wiring layers M31 and M35 are disposed as wiring interconnection layers, so as to be electrically connected to the wiring layer M42 and to be adjacent to the isolated patterns M32 and M34, respectively. This configuration causes the isolated patterns M32 and M34 to also capacitively couple with the wiring layers M31 and M35 as well as with the wiring layer M42, thus further increasing the capacitances of the first and second storage nodes SN1 and SN2.

As described above, in the embodiment, the first and second conductive layers CL1 and CL2 to be electrically connected to the first and second storage nodes SN1 and SN2 and the wiring layers M31 and M35 to be connected to the wiring layer M42 are formed by taking advantage of, for example, a process of forming part of the wiring layers of the logic circuit. Consequently, it is possible to dramatically increase the capacitances of the first and second storage nodes SN1 and SN2 and realize a sufficient reduction in soft errors by means of extremely simple configuration, without incurring an increase in the number of manufacturing steps and in the cost of manufacture. As a result, it is possible to fully meet a requirement for the further miniaturization of an SRAM.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A semiconductor memory device comprising: a first n-type transistor; a first p-type transistor; a first wiring layer having a first interconnecting portion for connecting a drain of said first n-type transistor via a contact plug and a drain of said first p-type transistor via a shared contact plug; and a second wiring layer having a first conductive portion electrically connected to said first interconnecting portion; wherein said second wiring layer includes said first conductive portion adjacent to a first wiring of power line which supplies a first power supply voltage to be supplied to the first p-type transistor and a second wiring of power line which supplies a second power supply voltage to be supplied to the first n-type transistor in said second wiring layer, wherein a portion of a first bit line is provided in the second wiring layer and a distance between said first conductive portion and said portion of first bit line is larger than a distance between the said first conductive portion and said first wiring of power line, wherein said second wiring layer is formed in a layer above said first wiring layer.

2. The semiconductor memory device according to claim 1, wherein said first wiring layer contains copper.

3. The semiconductor memory device according to claim 1, further including:
a second n-type transistor; a second p-type transistor;
a second interconnecting portion formed in said first wiring layer to connect a drain of said second n-type transistor and a drain of said second p-type transistor; and
a second conductive portion formed in said second wiring layer and electrically connected to said second interconnecting portion.

4. The semiconductor memory device according to claim 3, further including a second bit line, wherein a distance between said second conductive portion and said second bit line is larger than a distance between said second conductive portion and said first wiring of power line.

5. The semiconductor memory device according to claim 3, wherein said second conductive portion is formed in a layer above said second interconnecting portion.

6. The semiconductor memory device according to claim 3, wherein said first conductive portion and said second conductive portion are disposed adjacent to each other.

7. The semiconductor memory device according to claim 1, further including a logic circuit, wherein said first conductive portion is formed in an identical layer as a third wiring of said logic circuit.

8. The semiconductor memory device according to claim 3, further including a logic circuit, wherein said first conductive portion and said second conductive portion are formed in an identical layer as a third wiring of said logic circuit.

9. The semiconductor memory device according to claim 1, wherein said semiconductor memory device is an SRAM.

10. The semiconductor memory device according to claim 1, wherein said portion of the first bit line is in an identical horizontal plane with said first conductive portion.

* * * * *